(12) United States Patent
Saito et al.

(10) Patent No.: US 12,740,458 B2
(45) Date of Patent: Sep. 15, 2026

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventors: Nozomi Saito, Tokyo (JP); Yuki Yano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 379 days.

(21) Appl. No.: 18/683,482

(22) PCT Filed: Nov. 18, 2021

(86) PCT No.: PCT/JP2021/042363
§ 371 (c)(1),
(2) Date: Feb. 13, 2024

(87) PCT Pub. No.: WO2023/089714
PCT Pub. Date: May 25, 2023

(65) Prior Publication Data

US 2024/0355774 A1 Oct. 24, 2024

(51) Int. Cl.
*H10W 72/00* (2026.01)
*H10W 70/685* (2026.01)
(Continued)

(52) U.S. Cl.
CPC ....... *H10W 70/685* (2026.01); *H10W 74/137* (2026.01); *H10W 72/07602* (2026.01);
(Continued)

(58) Field of Classification Search
CPC ............. H10W 70/685; H10W 74/137; H10W 72/07602; H10W 72/646; H10W 72/886;
(Continued)

(56) References Cited

U.S. PATENT DOCUMENTS 11,088,042 B2 * 8/2021 Tanie .................. H10W 40/255
2021/0217721 A1 7/2021 Umeda et al.

FOREIGN PATENT DOCUMENTS

NL 2022620 A 9/2019
WO 2017/122491 A1 7/2017
(Continued)

OTHER PUBLICATIONS

International Search Report issued in PCT/JP2021/042363; mailed Jan. 11, 2022.

(Continued)

*Primary Examiner* — David Vu
(74) *Attorney, Agent, or Firm* — Studebaker Brackett PLLC

(57) ABSTRACT

The object is to provide a technology for enabling reduction of adhesion of a bonding material to a particular electrode. A semiconductor device includes: a semiconductor element with a surface including a first electrode and a second electrode; a protective film formed on the surface of the semiconductor element and having insulating properties, the protective film exposing the first electrode and the second electrode; a metal lead electrode bonded to the first electrode exposed from the protective film; and a bonding material with which the first electrode exposed from the protective film is bonded to the metal lead electrode. The metal lead electrode includes an abutment portion being a protrusion abutting the protective film and blocking between the bonding material and the second electrode in a cross-sectional view.

7 Claims, 9 Drawing Sheets

(51) Int. Cl.
*H10W 74/10* (2026.01)
*H10W 72/60* (2026.01)
*H10W 90/00* (2026.01)

(52) U.S. Cl.
CPC ........ *H10W 72/646* (2026.01); *H10W 72/886* (2026.01); *H10W 90/00* (2026.01); *H10W 90/734* (2026.01); *H10W 90/755* (2026.01); *H10W 90/765* (2026.01)

(58) Field of Classification Search
CPC . H10W 90/00; H10W 90/734; H10W 90/755; H10W 90/765; H10W 72/076; H10W 72/30; H10W 72/60
See application file for complete search history.

(56) References Cited

FOREIGN PATENT DOCUMENTS

| | | | |
|---|---|---|---|
| WO | 2019/167254 | A1 | 9/2019 |
| WO | 2020/208677 | A1 | 10/2020 |

OTHER PUBLICATIONS

"Notice of Reasons for Refusal" Office Action issued in JP 2023-561999; mailed by the Japanese Patent Office on Oct. 1, 2024.

* cited by examiner

F I G. 2
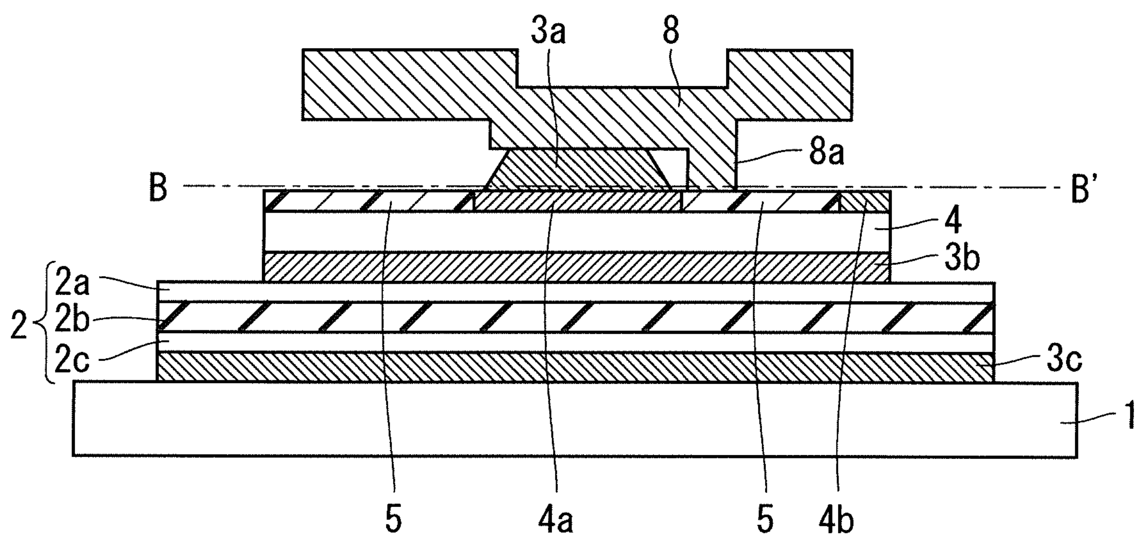

F I G. 4
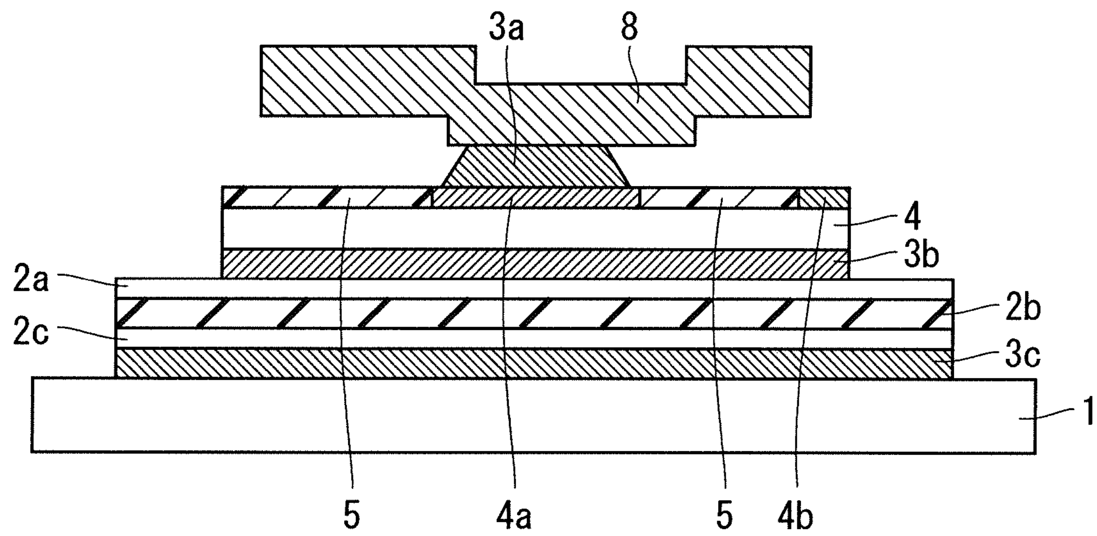

F I G. 5
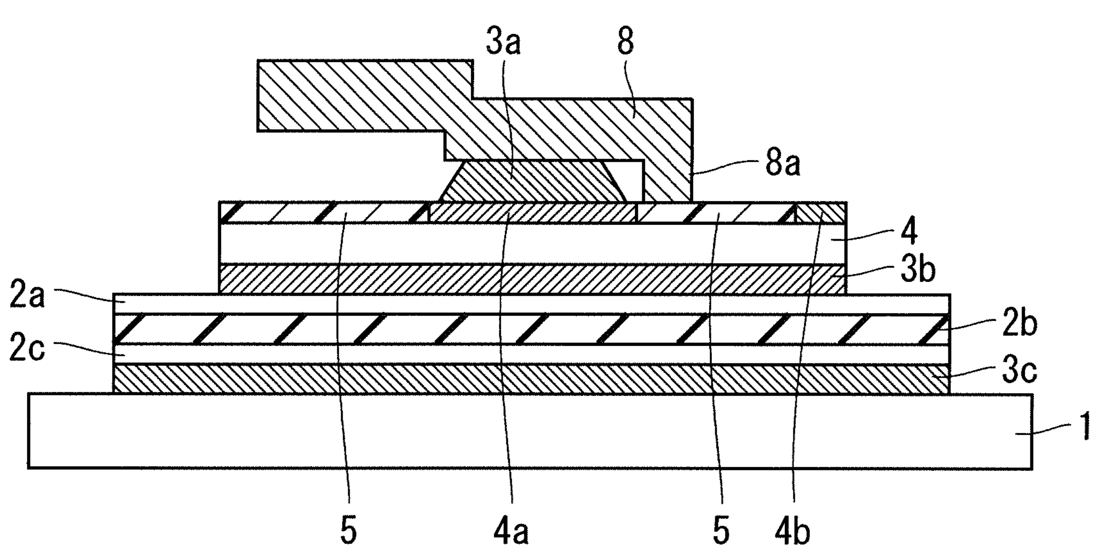

F I G. 8
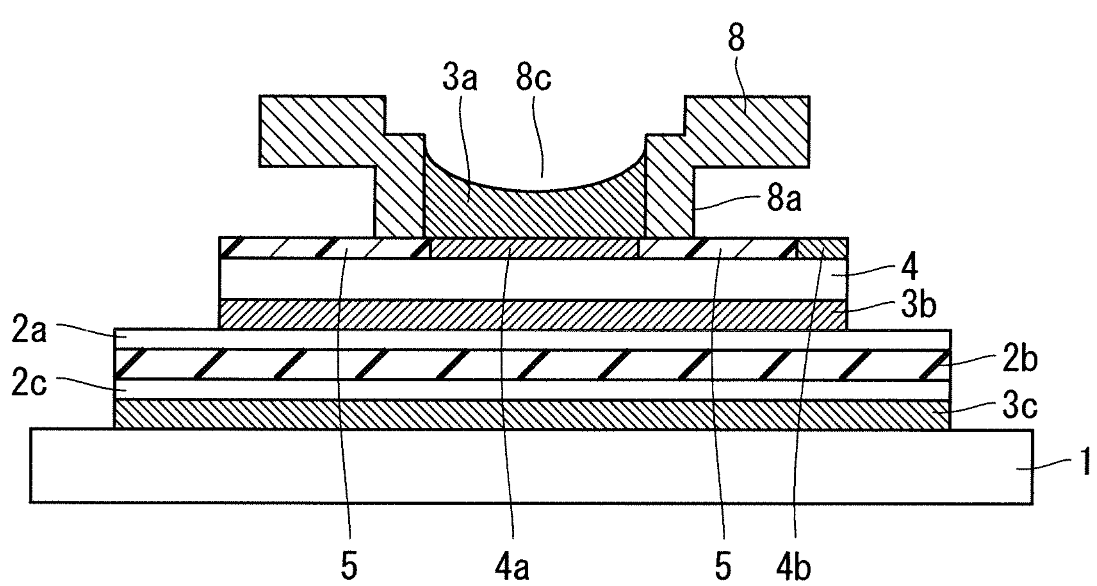

SEMICONDUCTOR DEVICE AND METHOD FOR MANUFACTURING SEMICONDUCTOR DEVICE

TECHNICAL FIELD

The present disclosure relates to a semiconductor device and a method for manufacturing the semiconductor device.

BACKGROUND ART

To pursue larger currents, longer life, and higher reliability, what has been proposed are semiconductor devices such as power semiconductor devices each with a structure including a plate-shaped metal lead electrode instead of a metal wire bond. In a step of melting a bonding material with which a metal lead electrode is bonded to a surface electrode of a semiconductor element in manufacturing steps of these structures, however, the bonding material sometimes flies off to the surroundings due to volatilization of an activator contained in the bonding material or ejection of bubbles in the bonding material. This sometimes causes the bonding material to adhere to a control electrode on the semiconductor element, thus making it difficult to wire bond the control electrode in a latter wiring step. Consequently, a problem of worsening the reliability and the productivity has occurred.

To address this, a semiconductor device including a metal lead electrode bonded to a main electrode through a bonding material and including an electrical connection piece that is a protrusion is proposed (e.g., Patent Document 1). Since the electrical connection piece can inhibit the bonding material from flying off under such a technology, a decrease in the reliability of the semiconductor device can be inhibited.

PRIOR ART DOCUMENT

Patent Document

Patent Document 1: WO2019/167254

SUMMARY

Problem to be Solved by the Invention

However, there is a crevice under the electrical connection piece, which still causes a problem in that the bonding material flies off and adheres to an electrode such as a control electrode.

The present disclosure has been conceived in view of the problem, and has an object of providing a technology for enabling reduction of adhesion of a bonding material to a particular electrode.

Means to Solve the Problem

A semiconductor device according to the present disclosure includes: a semiconductor element with a surface including a first electrode and a second electrode that are separated from each other; a protective film formed on the surface of the semiconductor element and having insulating properties, the protective film exposing the first electrode and the second electrode; a metal lead electrode bonded to the first electrode exposed from the protective film; and a bonding material with which the first electrode exposed from the protective film is bonded to the metal lead electrode, wherein the metal lead electrode includes an abutment portion being a protrusion abutting the protective film and blocking between the bonding material and the second electrode in a cross-sectional view.

Effects of the Invention

According to the present disclosure, the metal lead electrode includes an abutment portion being a protrusion abutting the protective film and blocking between the bonding material and the second electrode in a cross-sectional view. This structure can reduce adhesion of a bonding material to a particular electrode.

The objects, features, aspects, and advantages of the present disclosure will become more apparent from the following detailed description and the accompanying drawings.

BRIEF DESCRIPTION OF DRAWINGS

FIG. 2 is a cross-sectional view of a part of the semiconductor device according to Embodiment 1.

FIG. 4 is a cross-sectional view of a part of a relevant semiconductor device.

FIG. 5 is a cross-sectional view of a part of a semiconductor device according to Embodiment 2.

FIG. 8 is a cross-sectional view of a part of a semiconductor device according to Embodiment 4.

DESCRIPTION OF EMBODIMENTS

Figure 1:
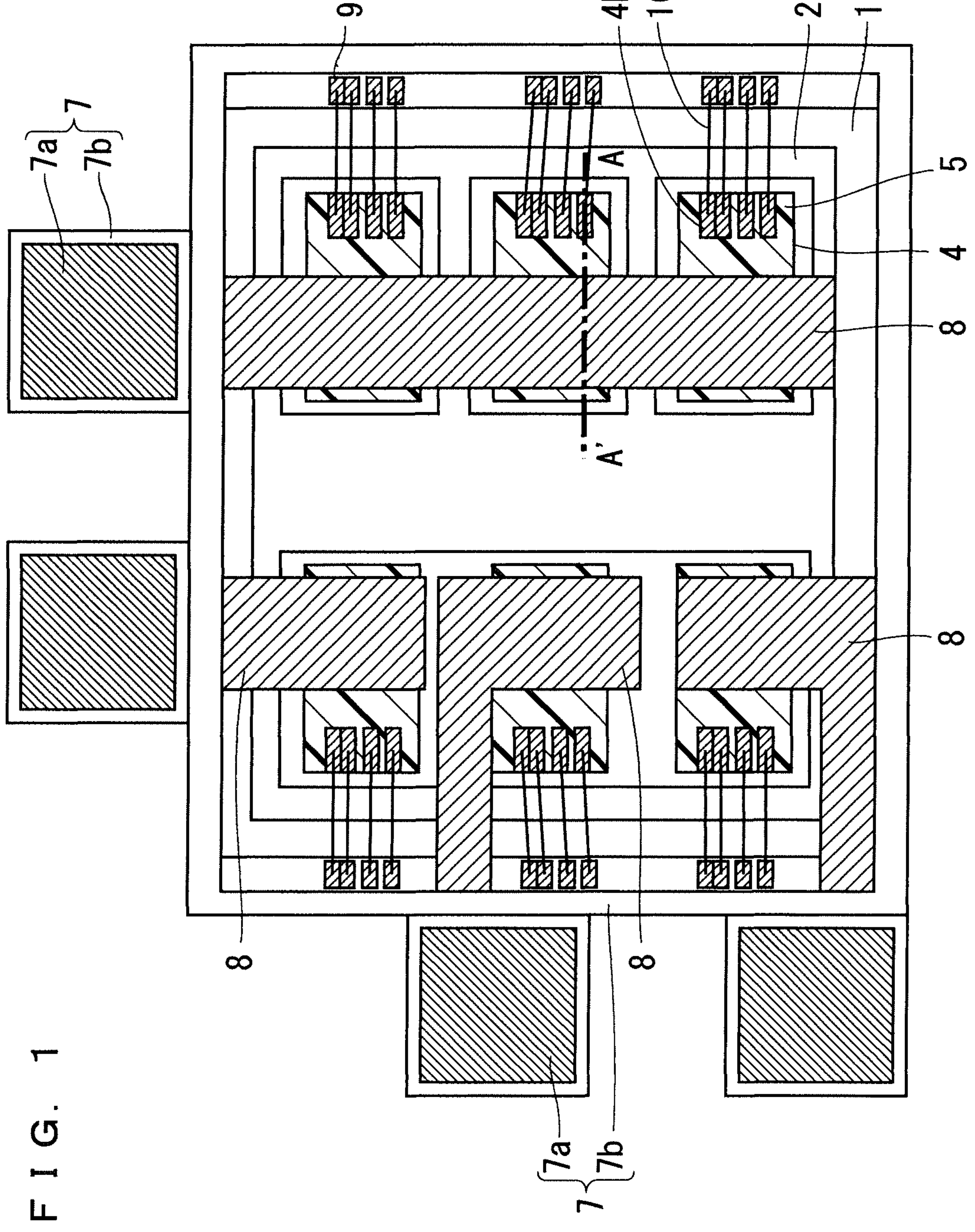
FIG. 1 is a plan view schematically illustrating a structure of a semiconductor device according to Embodiment 1.

Hereinafter, Embodiments will be described with reference to the accompanying drawings. The features to be described in Embodiments below are mere exemplifications, and all of the features are not necessarily essential. In the description below, identical constituent elements in a plurality of Embodiments will be denoted by the same or similar reference numerals, and the different constituent elements will be mainly described. In the following description, a particular position and a particular direction such as "up", "down", "left", "right", "front", or "back" need not always coincide with an actual position and an actual direction.

Embodiment 1

Figure 3:
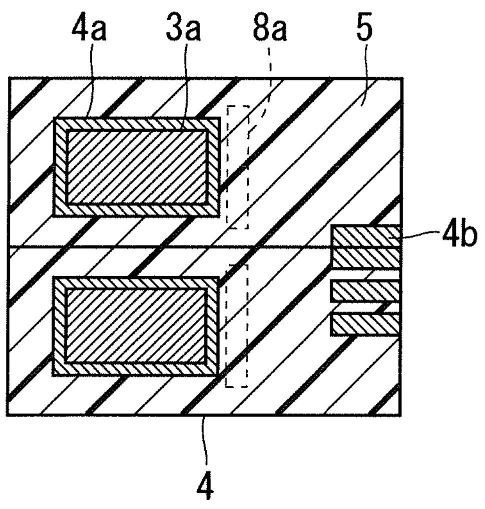
FIG. 3 is a plan view of the part of the semiconductor device according to Embodiment 1.

FIG. 1 is a plan view schematically illustrating a structure of a semiconductor device according to Embodiment 1. FIG. 2 is a cross-sectional view taken along the line A-A' of FIG. 1. FIG. 3 is a plan view taken along the line B-B' of FIG. 2.

The semiconductor device according to Embodiment 1 includes a base plate 1, a circuit board 2, bonding materials 3*a*, 3*b*, and 3*c*, semiconductor elements 4, protective films 5, a casing 7, metal lead electrodes 8, external signal terminals 9, metal wire 10, and a sealant that is not illustrated.

The base plate 1 is made of a material with superior thermal conductivity, for example, an aluminum alloy or copper.

The circuit board 2 in FIG. 2 includes circuit patterns 2*a* and 2*c*, and an insulating layer 2*b*. The insulating layer 2*b* is made of, for example, a ceramic with superior thermal conductivity such as aluminum nitride or silicon nitride, or a resin. The circuit pattern 2*a* is disposed on an upper surface of the insulating layer 2*b*, and the circuit pattern 2*c* is disposed on a lower surface of the insulating layer 2*b*. The circuit patterns 2*a* and 2*c* are made of a material with superior thermal conductivity, for example, an aluminum alloy or copper.

The bonding materials 3*c* bonds the base plate 1 to the circuit pattern 2*c*. The bonding material 3*b* bonds the circuit pattern 2*a* of the circuit board 2 to the semiconductor element 4 mounted on the circuit board 2. The bonding materials 3*b* and 3*c*, and the bonding material 3*a* to be described later are made of, for example, solder or soft solder.

A surface electrode 4*a* that is a first electrode is separated from a control electrode 4*b* that is a second electrode. The semiconductor element 4 has a surface including the surface electrode 4*a* and the control electrode 4*b*. The surface electrode 4*a* is a main electrode through which a relatively large current flows. The control electrode 4*b* is an electrode for controlling the semiconductor element 4 with a signal. The surface electrode 4*a* and the control electrode 4*b* are made of, for example, at least one of nickel (Ni) or gold (Au). When the semiconductor element 4 includes an aluminum (Al)-silicon (Si) layer, the surface electrode 4*a* and the control electrode 4*b* are disposed on the Al—Si layer.

The semiconductor element 4 according to Embodiment 1 is, though not limited to, an insulated-gate bipolar transistor (IGBT) but may be, for example, a reverse conducting IGBT, a metal-oxide semiconductor field-effect transistor (MOSFET), a Schottky barrier diode (SBD), or a PN junction diode (PND). The semiconductor element 4 may be made of, for example, normal silicon (Si), or a wide bandgap semiconductor such as silicon carbide (SiC), gallium nitride (GaN), or diamond. The semiconductor element 4 made of a wide bandgap semiconductor can stably operate at high temperatures and high voltages, and accelerate the switching speed. The number of the semiconductor elements 4 is, though not limited to, six in FIG. 1 but is determined according to the usage of the semiconductor device.

The protective film 5 in FIG. 2 is disposed on the surface of the semiconductor element 4 including the surface electrode 4*a* and the control electrode 4*b*, and exposes the surface electrode 4*a* and the control electrode 4*b*. The protective film 5 has insulating properties, and is made of, for example, polyimide.

The bonding material 3*a* bonds the metal lead electrodes 8 to the surface electrodes 4*a* exposed from the protective films 5. Thus, the metal lead electrodes 8 are bonded to the surface electrodes 4*a* exposed from the protective films 5. Portions of the metal lead electrodes 8 facing the surface electrodes 4*a* protrude toward the surface electrodes 4*a*, and include abutment portions 8*a*. The abutment portions 8*a* are protrusions that abut the protective films 5 and block between the bonding material 3*a* and the control electrodes 4*b* through the abutment in a cross-sectional view (see FIG. 2). Since the bonding material 3*a* coincides in position with the surface electrodes 4*a*, the abutment portions 8*a* substantially block between the surface electrodes 4*a* and the control electrodes 4*b* in a cross-sectional view.

Each of the abutment portions 8*a* illustrated by dotted lines in the plan view of FIG. 3 principally blocks between the bonding material 3*a* and the control electrode 4*b*. Connecting a part of the metal lead electrodes 8 to the circuit pattern 2*a* of the circuit board 2 may form a circuit, which is not illustrated.

The casing 7 in FIG. 1 includes external electrodes 7*a* and casing resin parts 7*b*. The external electrodes 7*a* are electrically connected to the metal lead electrodes 8. The metal lead electrodes 8 may be a part of the external electrodes 7*a*, or parts different from the external electrodes 7*a*. When the metal lead electrodes 8 are a part of the external electrodes 7*a*, the metal lead electrodes 8 may be formed by extending the external electrodes 7*a* inserted in advance into the casing resin parts 7*b*, up to on the semiconductor elements 4. When the metal lead electrodes 8 are parts different from the external electrodes 7*a*, the metal lead electrodes 8 may be bonded to the external electrodes 7*a* inserted in advance into the casing resin parts 7*b* by, for example, solder joints, welding, or ultrasonic bonding.

The casing resin parts 7*b* surround the semiconductor elements 4 and the metal lead electrodes 8, and the space around the semiconductor elements 4 and the metal lead electrodes 8. A sealant that is not illustrated is provided in the space. Part of the external electrodes 7*a* is exposed from the casing resin parts 7*b* outside the space. An external apparatus connected to the outside part of the external electrodes 7*a* is electrically connected to the semiconductor elements 4 through the external electrodes 7*a* and the metal lead electrodes 8. The sealant is made of, for example, a resin.

The external signal terminals 9 are disposed in the casing resin parts 7*b*, similarly to the external electrodes 7*a*. Electrically connecting the external signal terminal 9 to the control electrode 4*b* through the metal wire 10 forms a signal circuit. The metal wire 10 is made of a metal high in thermal conductivity and electric conductivity, for example, aluminum.

[Manufacturing Method]

Next, an example method for manufacturing the semiconductor device according to Embodiment 1 will be described.

[Procedure S1]

During the process of forming the semiconductor elements 4, the surface electrode 4*a* and the control electrode 4*b* are formed on each of the semiconductor elements 4. Then, the protective film 5 is formed on the Al—Si layer of the semiconductor element 4 except the surface electrode 4*a* and the control electrode 4*b* to protect the Al—Si layer. Since the surface electrode 4*a* and the control electrode 4*b* are subjected to metal joining or ultrasonic bonding in a latter step, the protective film 5 made of, for example, polyimide is not formed on the surface electrode 4*a* and the control electrode 4*b*. A portion of the protective film 5 to be abutted by the abutment portion 8*a* of the metal lead electrode 8 in a latter step may be thicker than the other portions.

[Procedure S2]

The base plate 1, the circuit board 2, and the semiconductor elements 4 are bonded together through the bonding materials 3*b* and 3*c* such as plate solder, soldering paste, or soft solder. Generally, solder is often used as the bonding materials 3*b* and 3*c*. The bonding in the procedure S2 is performed by heating the bonding materials 3*b* and 3*c*, for example, solder to be applied, to a temperature exceeding the melting point. The bonding materials 3*b* and 3*c* may be components molded in advance, for example, plate solder, or a component such as soldering paste to be applied through, for example, screen printing or a dispenser.

[Procedure S3]

The casing 7 is bonded to the base plate 1. For example, after a silicone-based or epoxy-based adhesive that is not illustrated is applied to a bonding surface of the base plate 1 below the casing resin parts 7*b*, a load is applied to the base plate 1 on which the semiconductor elements 4 are mounted in the procedure S2, so that the casing resin parts 7*b* are bonded in tight contact with the base plate 1. Fastening the casing 7 to the base plate 1 is not limited to this. For example, the casing resin parts 7*b* and the base plate 1 may be secured to each other through self-tapping screws that are not illustrated. Alternatively, after the casing resin parts 7*b* are fastened to the base plate 1 by, for example, a clamp fixture, they may be fastened to each other by heating an adhesive.

[Procedure S4]

The metal lead electrodes 8 are disposed on the semiconductor elements 4 to bond the surface electrodes 4*a* to the metal lead electrodes 8. Before this bonding, first, the abutment portions 8*a* of the metal lead electrodes 8 are disposed in abutment on the protective films 5 on the surfaces of the semiconductor elements 4. These abutment portions 8*a* block between the bonding material 3*a* and the control electrodes 4*b*. The protrusions of the abutment portions 8*a* may be formed by, for example, press working in a process of molding the metal lead electrodes 8, or folding as described in Embodiment 2.

Simultaneously with abutment of the abutment portions 8*a* to the protective films 5, the bonding material 3*a* for bonding the surface electrodes 4*a* of the semiconductor elements 4 to the metal lead electrodes 8 is supplied. Before the metal lead electrodes 8 are disposed on the semiconductor elements 4, the bonding material 3*a* may be supplied on the surface electrodes 4*a* of the semiconductor elements 4 in dispense application or screen printing. Alternatively, the bonding material 3*a* may be supplied from at least one through hole formed in advance in the metal lead electrodes 8, after the metal lead electrodes 8 are disposed on the semiconductor element 4 as described in Embodiments 4 and 5. Alternatively, the bonding material 3*a* may be supplied on the surface electrodes 4*a* of the semiconductor elements 4 as reserve solder in, for example, dispense application or screen printing in the procedure S2.

After disposing the metal lead electrodes 8 and supplying the bonding material 3*a*, the metal lead electrodes 8 are bonded to the surface electrodes 4*a* of the semiconductor elements 4 by heating the bonding material 3*a* to a temperature exceeding the melting point similarly to the procedure S2. Although the melting point of the bonding material 3*a* is preferably lower than that of the bonding material 3*b*, the melting points may be equivalent.

[Procedure S5]

The control electrodes 4*b* on the semiconductor elements 4 and the external signal terminals 9 are wire bonded through the metal wire 10 to be electrically connected to the signal circuit for controlling the semiconductor elements 4. For example, ultrasonic bonding is used for the wire bonding.

[Procedure S6]

The sealant that is not illustrated seals the space surrounded by the casing resin parts 7*b* in the structure assembled through the procedures S1 to S5. The sealant is made of, though not limited to, silicone gel or an epoxy resin, but may be made of any material having desired properties on, for example, a modulus of elasticity, heat resistance, adhesiveness, and a thermal expansion coefficient. The assembled structure is put into, for example, a curing furnace so that the sealant is cured as necessary. Consequently, the semiconductor device is completed. Then, the semiconductor device is inspected on, for example, necessary electrical characteristics.

Conclusion of Embodiment 1

FIG. 4 is a cross-sectional view illustrating a structure of a semiconductor device relevant to the semiconductor device according to Embodiment 1 (hereinafter referred to as a "relevant semiconductor device"), and corresponds to FIG. 2. In the procedure S4 of melting the bonding material 3*a*, a part of the bonding material 3*a* sometimes flies off due to volatilization of an activated component in the bonding material 3*a* (e.g., flux in plate solder) or ejection of bubbles in the bonding material 3*a*.

Since the relevant semiconductor device does not include the abutment portions 8*a* according to Embodiment 1, the part of the bonding material 3*a* that has flied off sometimes adheres to the control electrodes 4*b*. This consequently makes it difficult to wire bond the control electrodes 4*b* in the wiring step of the procedure S5, and causes a problem of worsening the reliability and the productivity.

In contrast, since the abutment portions 8*a* block between the bonding material 3*a* and the control electrodes 4*b* in a cross-sectional view according to Embodiment 1, adhesion of the bonding material 3*a* to the control electrodes 4*b* can be reduced. Consequently, we can expect that semiconductor devices of long life can be stably manufactured.

Embodiment 2

FIG. 5 is a cross-sectional view illustrating a structure of a semiconductor device according to Embodiment 2, and corresponds to FIG. 2. Each of the abutment portions 8*a* according to Embodiment 1 is formed in the center of the metal lead electrode 8 in a surface direction as illustrated in FIG. 2. The abutment portion 8*a* according to Embodiment 2 is formed at an end (at a right end in FIG. 5) of the metal lead electrode 8 in the surface direction as illustrated in FIG. 5. The basic structure other than this is identical to that according to Embodiment 1.

The aforementioned structure according to Embodiment 2 can reduce adhesion of the bonding material 3*a* to the control electrodes 4*b* similarly to Embodiment 1. Furthermore, since the abutment portions 8*a* can be formed by folding that is a relatively easy process, we can expect reduction in the manufacturing cost.

Embodiment 3

Figure 6:
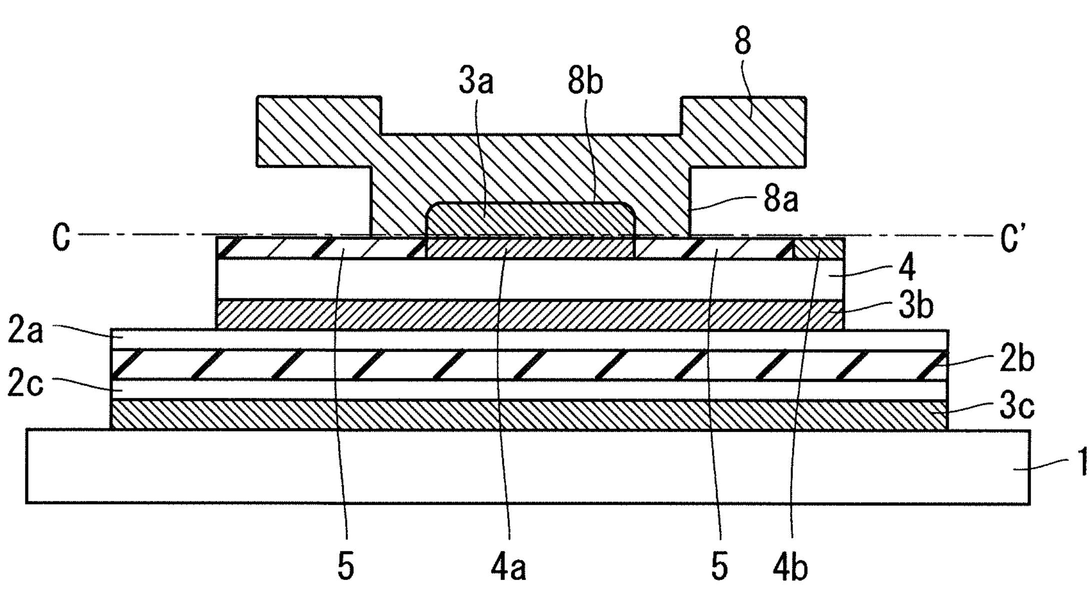
FIG. 6 is a cross-sectional view of a part of a semiconductor device according to Embodiment 3.
Figure 7:
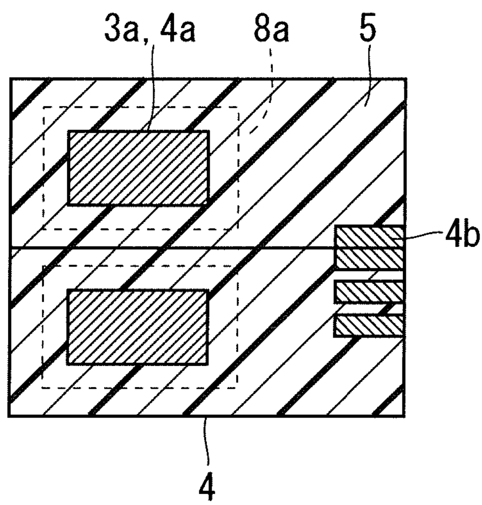
FIG. 7 is a plan view of the part of the semiconductor device according to Embodiment 3.

FIG. 6 is a cross-sectional view illustrating a structure of a semiconductor device according to Embodiment 3, and corresponds to FIG. 2. FIG. 7 is a plan view taken along the line C-C' of FIG. 6.

As illustrated in FIG. 6, each of the metal lead electrodes 8 according to Embodiment 3 includes a dent 8*b* in a lower portion of the metal lead electrode 8. The dent 8*b* in the example of FIG. 6 is domical, which is not limited to this.

The dent 8*b* contains the bonding material 3*a*. In the example of FIG. 6, the dent 8*b* is filled with the bonding material 3*a*. The edge of the dent 8*b* abuts the protective film 5, and includes the abutment portion 8*a*.

Each of the edges of the dents 8*b* illustrated by the dotted lines in the plan view of FIG. 73 encloses the whole perimeter of the bonding material 3*a* in a plan view. The abutment portions 8*a* completely block between the bonding material 3a and the control electrodes 4b. The metal lead electrode 8 may have a through hole that goes from its upper surface to the bottom of the dent 8b. The basic structure other than this is identical to that according to Embodiment 1.

The structure according to Embodiment 3 can reduce adhesion of the bonding material 3a to the control electrodes 4b similarly to Embodiment 1. Furthermore, the edges of the dents 8b each enclosing the whole perimeter of the bonding material 3a can reduce the bonding material 3a flying off and adhering to not only the control electrodes 4b but also other portions (e.g., the circuit board 2 or the other semiconductor elements 4). This can consequently inhibit a decrease in the insulating performance.

Furthermore, the contact area between the metal lead electrodes 8 and the bonding material 3a can be increased. This can reduce a current density in using the semiconductor device, and inhibit a decrease in the reliability due to locally generated heat.

Embodiment 4

FIG. 8 is a cross-sectional view illustrating a structure of a semiconductor device according to Embodiment 4, and corresponds to FIG. 2.

As illustrated in FIG. 8, each of the metal lead electrodes 8 according to Embodiment 4 includes a through hole 8c containing the bonding material 3a. Furthermore, the edge of the through hole 8c abuts the protective film 5, and encloses the whole perimeter of the bonding material 3a in a plan view, similarly to the edge of the dent 8b according to Embodiment 3. The through hole 8c may be rectangular or circular in a plan view to correspond to the shape of the surface electrode 4a of the semiconductor element 4. The area of the through hole 8c in a plan view may be larger than that of the surface electrode 4a of the semiconductor element 4. The basic structure other than this is identical to that according to Embodiment 1.

The structure according to Embodiment 4 can reduce adhesion of the bonding material 3a not only to the control electrodes 4b similarly to Embodiment 3 but also to portions other than the control electrodes 4b. Since the metal lead electrodes 8 can have the through holes 8c that are relatively large, the bonding material 3a can be supplied from the through holes 8c of the metal lead electrodes 8 in dispense application after the metal lead electrodes 8 are disposed on the semiconductor elements 4. This can consequently facilitate supplying the bonding material 3a.

To inspect whether the bondability between the metal lead electrodes 8 and the bonding material 3a is normal, a nondestructive inspection on the bondability has been conventionally performed by ultrasonic flaw detection or by X-ray in some cases. In contrast, the bondability can be visually inspected based on whether the bonding material 3a wets up the wall surfaces of the through holes 8c of the metal lead electrodes 8 in Embodiment 4. This can simplify the inspection on the bondability. Thus, we can expect omission of the inspection by ultrasonic flaw detection or by X-ray.

Embodiment 5

Figure 9:
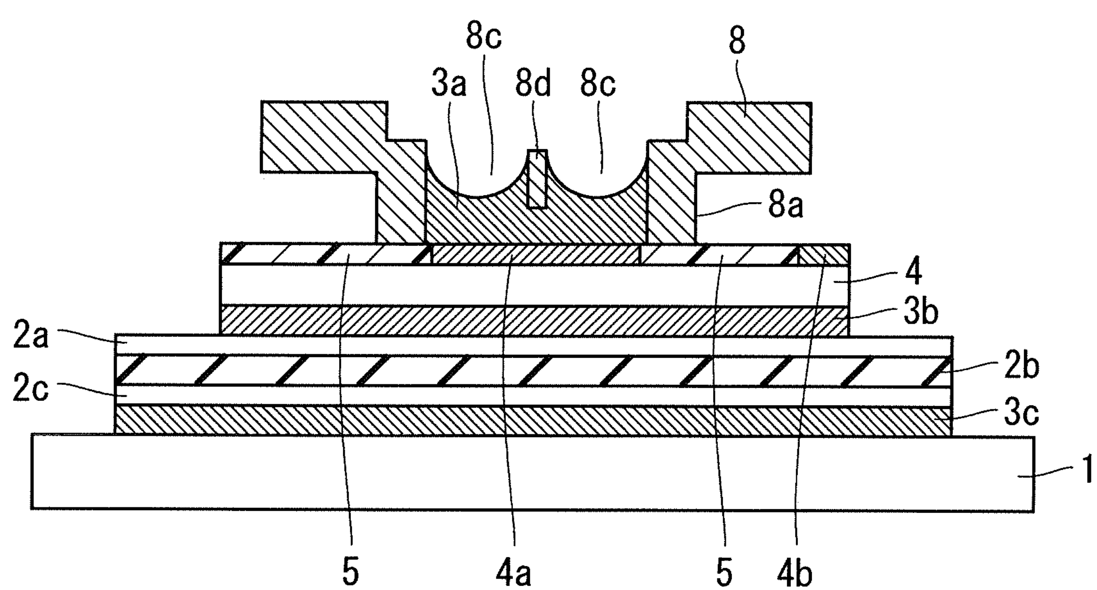
FIG. 9 is a cross-sectional view of a part of a semiconductor device according to Embodiment 5.

FIG. 9 is a cross-sectional view illustrating a structure of a semiconductor device according to Embodiment 5, and corresponds to FIG. 2.

As illustrated in FIG. 9, the metal lead electrodes 8 according to Embodiment 5 include a plurality of through holes 8c containing the bonding material 3a. The metal lead electrodes 8 include partitions 8d that partition the plurality of through holes 8c and are in contact with the bonding material 3a. The number, widths, and positions in a height direction of the partitions 8d are any. The basic structure other than these is identical to that according to Embodiment 4.

The structure according to Embodiment 5 can reduce adhesion of the bonding material 3a not only to the control electrodes 4b similarly to Embodiment 3, but also to portions other than the control electrodes 4b. Furthermore, the through holes 8c can facilitate supplying the bonding material 3a and simplify the inspection on the bondability similarly to Embodiment 4.

Furthermore, the partitions 8d can increase the contact area between the metal lead electrodes 8 and the bonding material 3a. This can reduce the current density in using the semiconductor device, and inhibit a decrease in the reliability due to locally generated heat. The partitions 8d can also reduce the amount of the bonding material 3a to be used.

Embodiments and modifications can be freely combined, and can be appropriately modified or omitted.

The foregoing description is in all aspects illustrative and not restrictive. Therefore, numerous modifications and variations that have not yet been exemplified will be devised.

EXPLANATION OF REFERENCE SIGNS

2 circuit board, 3a bonding material, 4 semiconductor element, 4a surface electrode, 4b control electrode, 5 protective film, 8 metal lead electrode, 8a abutment portion, 8b dent, 8c through hole, 8d partition.

The invention claimed is:

1. A semiconductor device, comprising:

a semiconductor element with a surface including a first electrode and a second electrode that are separated from each other;

a protective film formed on the surface of the semiconductor element and having insulating properties, the protective film exposing the first electrode and the second electrode;

a metal lead electrode bonded to the first electrode exposed from the protective film; and a bonding material with which the first electrode exposed from the protective film is bonded to the metal lead electrode, wherein the metal lead electrode includes an abutment portion being a protrusion abutting the protective film and blocking between the bonding material and the second electrode in a cross-sectional view.

2. The semiconductor device according to claim 1, further comprising a circuit board on which the semiconductor element is mounted, the circuit board being bonded to a part of the metal lead electrode.

3. The semiconductor device according to claim 1, wherein the abutment portion is formed at an end of the metal lead electrode in a surface direction.

4. The semiconductor device according to claim 1, wherein the metal lead electrode includes a dent containing the bonding material, and an edge of the dent abuts the protective film and includes the abutment portion.

5. The semiconductor device according to claim 1, wherein the metal lead electrode includes at least one through hole containing the bonding material, and an edge of the at least one through hole abuts the protective film and includes the abutment portion.

6. The semiconductor device according to claim 5, wherein the number of the at least one through hole is plural, and the metal lead electrode includes partitions partitioning the plural through holes and being in contact with the bonding material.

7. A method for manufacturing the semiconductor device according to claim 1, the method comprising melting the bonding material with the abutment portion abutting the protective film to bond the first electrode to the metal lead electrode through the bonding material.

* * * * *